(12) United States Patent
Zhang et al.

(10) Patent No.: US 12,342,558 B2
(45) Date of Patent: Jun. 24, 2025

(54) SPLIT GATE CSTBT WITH CURRENT CLAMPING PMOS AND MANUFACTURING METHOD THEREOF

(71) Applicant: University of Electronic Science and Technology of China, Chengdu (CN)

(72) Inventors: Jinping Zhang, Chengdu (CN);
Yuanyuan Tu, Chengdu (CN);
Rongrong Zhu, Chengdu (CN);
Zehong Li, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 634 days.

(21) Appl. No.: 17/752,889

(22) Filed: May 25, 2022

(65) Prior Publication Data

US 2023/0088637 A1 Mar. 23, 2023

(30) Foreign Application Priority Data

Sep. 23, 2021 (CN) .......................... 202111116185.9

(51) Int. Cl.
| | | |
|---|---|---|
| *H10D 12/00* | (2025.01) | |
| *H01L 21/761* | (2006.01) | |
| *H01L 21/765* | (2006.01) | |
| *H10D 12/01* | (2025.01) | |
| *H10D 62/10* | (2025.01) | |

(Continued)

(52) U.S. Cl.
CPC ......... *H10D 12/481* (2025.01); *H01L 21/761* (2013.01); *H01L 21/765* (2013.01); *H10D 12/038* (2025.01); *H10D 62/111* (2025.01); *H10D 62/393* (2025.01); *H10D 64/117* (2025.01)

(58) Field of Classification Search
CPC .. H10D 12/481; H10D 12/038; H10D 62/111; H10D 62/393; H10D 64/117; H01L 21/761; H01L 21/765
USPC ......................................................... 257/353
See application file for complete search history.

(56) References Cited

FOREIGN PATENT DOCUMENTS

| | | | | |
|---|---|---|---|---|
| CN | 110504310 A | * | 11/2019 | ....... H01L 21/26513 |
| CN | 110600537 A | * | 12/2019 | ......... H01L 29/0684 |

OTHER PUBLICATIONS

English translation CN-110600537-A (Year: 2019).*
English translation CN-110504310-A (Year: 2019).*

* cited by examiner

*Primary Examiner* — Igwe U Anya
(74) *Attorney, Agent, or Firm* — Bayramoglu Law Offices LLC (57) ABSTRACT

A split gate carrier stored trench bipolar transistor (CSTBT) with current clamping PMOS include a P-type buried layer and a split gate electrode with equal potential to an emitter metal on the basis of the traditional CSTBT, which effectively eliminates the influence of an N-type carrier stored layer on breakdown characteristics of the device through the charge compensation effect, and helps to improve the trade-off relationship between the on-state voltage drop and the turn-off loss. Moreover, the introduction of a parasitic PMOS structure can reduce the saturation current and improve short-circuit safe operating area of the device, reduce the Miller capacitance, and improve the switching speed of the device and reduce the switching loss of the device. In addition, the split gate CSTBT integrating the split gate electrode and gate electrode in the same trench can shorten the distance between PMOS and NMOS channels.

5 Claims, 8 Drawing Sheets

(51) Int. Cl.
*H10D 62/17* (2025.01)
*H10D 64/00* (2025.01)

SPLIT GATE CSTBT WITH CURRENT CLAMPING PMOS AND MANUFACTURING METHOD THEREOF

CROSS REFERENCE TO THE RELATED APPLICATIONS

This application is based upon and claims priority to Chinese Patent Application No. 202111116185.9, filed on Sep. 23, 2021, the entire contents of which are incorporated herein by reference.

TECHNICAL FIELD

The present invention relates to the technical field of power semiconductor devices, in particular to a split gate carrier stored trench bipolar transistor (CSTBT) with current clamping PMOS and a manufacturing method thereof.

BACKGROUND

Insulated Gate Bipolar Transistor (IGBT) combines the advantages of Metal-Oxide-Semiconductor Field-Effect Transistor (MOSFET) and Bipolar Junction Transistor (BJT). It not only has the advantages of easy driving, high input impedance and fast switching speed of MOSFET, but also has the advantages of high current density, low on-state voltage drop, low loss and high stability of BJT. Therefore, IGBT has become one of the core electronic components in modern power electronic circuits and has been widely used in transportation, communication, household appliances and aerospace fields. The application of IGBT has greatly improved the performance of power electronic systems.

Figure 1:
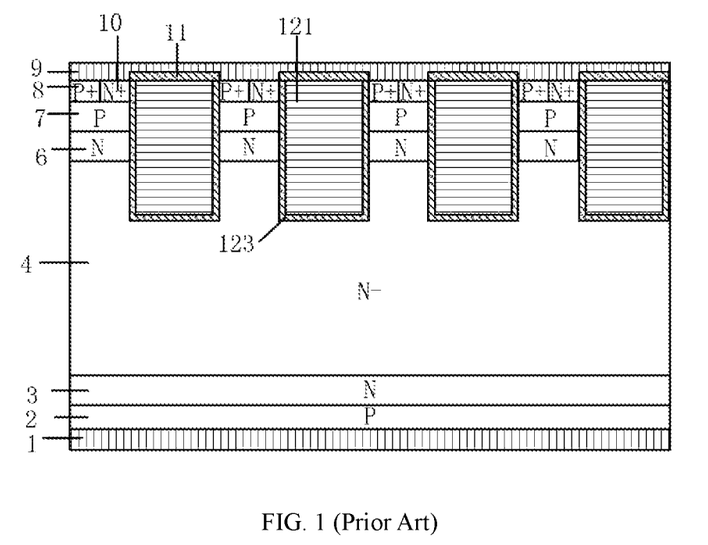
FIG. 1 is a structural schematic diagram of a conventional CSTBT device with four cells connected in parallel.

Since IGBT was invented in 1980s, it has been developing along the trend of reducing switching loss, increasing operating frequency and improving reliability of devices. Based on the sixth generation Trench Field-Stop type IGBT, the carrier stored trench bipolar transistor (CSTBT) is manufactured by introducing an N-type carrier stored layer with high doping and a certain thickness under the P-type base region. The introduction of the N-type carrier stored layer improves the hole barrier, improves the carrier distribution, enhances the conductance modulation effect in the drift region, reduces the on-state voltage drop of the device, and optimizes a trade-off relationship between the on-state voltage drop and the switching loss of the device. However, the traditional CSTBT (shown in FIG. 1) also has some drawbacks. For example, the introduction of the N-type carrier stored layer improves the carrier distribution in the drift region and forward conduction characteristics, but with the increase of doping concentration of the N-type carrier stored layer, breakdown characteristics of devices are degraded unfortunately, which limits the application of the devices in high voltage fields. Another disadvantage is that for trench IGBT, in order to improve integration of a chip, the trench density is relatively large, which leads to the larger saturation current when the device is saturated. The large saturation current will make poor short-circuit safe working ability. The saturation current can be reduced by decreasing the trench density, but this will make the current distribution on the device surface uneven and affect the reliability of the device. And the increase in the trench density will also increase the gate capacitance and switching loss of the device.

SUMMARY

The technical problem to be solved by the present invention is to provide a split gate CSTBT with current clamping PMOS and a manufacturing method thereof for the problems existing in the prior art. The invention aims to avoid degradation of breakdown characteristics caused by the introduction of carrier stored layer, and disadvantages of large gate capacitance and saturation current caused by large channel density.

In order to solve the above technical problems, the present invention provides a split gate CSTBT with current clamping PMOS. The cell structure includes a back collector metal 1, a P-type collector region 2, an N-type field stop layer 3 and an N-drift region 4 which are stacked in sequence from bottom to top. The upper layer of the N-drift region 4 has a P-type buried layer 5 and a trench structure which are alternately arranged, and the depth of the lower surface of the trench structure is greater than the junction depth of the lower surface of the P-type buried layer 5;

The upper surface of the P-type buried layer 5 is provided with an N-type carrier stored layer 6, the upper surface of the N-type carrier stored layer 6 is provided with a P-type base region 7, and the upper surface of the P-type base region 7 is provided with an N+ emitter region 10 and a P+ emitter region 8 in side contact with each other;

The trench structure includes a gate electrode 121, a split gate electrode 122, a gate dielectric layer 123, a split gate dielectric layer 124, and a polysilicon isolation dielectric layer 125. The gate electrode 121 and the split gate electrode 122 are isolated by the polysilicon isolation dielectric layer 125; the depth of the lower surface of the gate electrode 121 is greater than the junction depth of the lower surface of the P-type buried layer 5. The gate electrode 121 is connected to one side of the N-drift region 4, the P-type buried layer 5, the N-type carrier stored layer 6, the P-type base region 7 and the N+ emitter region 10 through the gate dielectric layer 123. The depth of the lower surface of the split gate electrode 122 is greater than the depth of the lower surface of the P-type buried layer 5. The split gate electrode 122 is connected to the other side of the N-drift region 4, the P-type buried layer 5, the N-type carrier stored layer 6, the P-type base region 7 and the P+ emitter region 8 through the split gate dielectric layer 124.

The upper surfaces of the gate electrode 121, the gate dielectric layer 123, and the polysilicon isolation dielectric layer 125 are covered with an insulating dielectric layer 11; the upper surfaces of the split gate electrode 122, the split gate dielectric layer 124, the insulating dielectric layer 11, the N+ emitter region 10, and the P+ emitter region 8 are covered with an emitter metal 9. The split gate electrode 122 and the emitter metal 9 have equal potentials.

In order to solve the above technical problems, the present invention provides a split gate CSTBT with current clamping PMOS. The cell structure of includes a back collector metal 1, a P-type collector region 2, an N-type field stop layer 3 and an N-drift region 4 which are stacked in sequence from bottom to top. A P-type buried layer 5 and a trench structure are alternately arranged on the upper layer of the N-drift region 4. And the depth of the lower surface of the trench structure is greater than the junction depth of the lower surface of the P-type buried layer 5;

the upper surface of the P-type buried layer 5 is provided with an N-type carrier stored layer 6. And the upper surface of the N-type carrier stored layer 6 is provided with a P-type base region 7, and the upper layer of P-type base region 7 has an N+ emitter region 10 on the side near the gate electrode;

The trench structure includes a gate electrode 121, a split gate electrode 122, a gate dielectric layer 123, a split gate dielectric layer (124), and a polysilicon isolation dielectric layer 125. The gate electrode 121 and the split gate electrode 122 are isolated by the polysilicon isolation dielectric layer 125. And the depth of the lower surface of the gate electrode 121 is greater than the junction depth of the lower surface of the P-type buried layer 5. The gate electrode 121 is connected to one side of the N-drift region 4, the P-type buried layer 5, the N-type carrier stored layer 6, the P-type base region 7 and the N+ emitter region 10 through the gate dielectric layer 123. And the depth of the lower surface of the split gate electrode 122 is greater than the depth of the lower surface of the P-type buried layer 5. The split gate electrode 122 is connected to the other side of the N-drift region 4, the P-type buried layer 5, the N-type carrier stored layer 6 and the P-type base region 7 through the split gate dielectric layer 124;

The upper surface of the P-type base region 7 is covered with a Schottky contact metal 13. The upper surfaces of the gate electrode 121, the gate dielectric layer 123, and the polysilicon isolation dielectric layer 125 are covered with an insulating dielectric layer 11. The upper surfaces of the split gate electrode 122, the split gate dielectric layer 124, the insulating dielectric layer 11 and the N+ emitter region 10 are covered with an emitter metal 9. And the split gate electrode 122 and the Schottky contact metal 13 have equal potential with the emitter metal 9.

On the basis of the technical solution, the present invention can also be improved as follows.

Further, the split gate electrode 122 is L-shaped and half encloses the gate electrode 121. And the lower surface and side surface of the gate electrode 121 are isolated from the split gate electrode 122 by the polysilicon isolation dielectric layer 125.

Further, the N-drift region 4 has a super junction P-pillar 14 and a super junction N-pillar 15 in side contact with each other. The super junction N-pillar 15 is located below the P-type buried layer 5, and the super junction P-pillar 14 is located below the trench structure. And the super junction P-pillar 14 and the super junction N-pillar 15 meet charge balance requirements.

Further, the thickness of the split gate dielectric layer 124 is greater than that of the gate dielectric layer 123.

Further, a semiconductor material used in the device is any one or more of Si, SiC, GaAs, GaN, $Ga_2O_3$, AlN and diamond.

Further, the device structure is not only suitable for IGBT devices, but also suitable for MOSFET devices by replacing the P-type collector region 2 on the back surface of the device with an N-type doping.

In order to solve the above technical problems, the present invention provides a manufacturing method of a split gate CSTBT with current clamping PMOS, including the following steps:

step 1: adopting an N-type lightly doped monocrystalline silicon wafer as an N-drift region 4 of the device;

step 2: growing a layer of field oxide layer on a surface of the silicon wafer, resulting in an active region by photoetching, then growing a layer of pre-oxide layer, making a P-type buried layer 5 by ion implantation of P-type impurities above the N-drift region 4, making an N-type carrier stored layer 6 by ion implantation of N-type impurities on the upper surface of the P-type buried layer 5, and making a P-type base region 7 by ion implantation of the P-type impurities on the upper surface of the N-type carrier stored layer 6;

step 3: depositing a protective layer on the surface of the silicon wafer, photoetching a window to perform trench silicon etching, thereby etching and forming a plurality of split gate trenches on the top layer of the N-drift region 4, wherein the N-drift region 4, the P-type buried layer 5, the N-type carrier stored layer 6 and the P-type base region 7 are arranged between each split gate trench, and the depth of the lower surface of each split gate trench is greater than the junction depth of the lower surface of the P-type buried layer 5;

step 4: forming dielectric layers on the bottom and side walls of the split gate trench as split gate dielectric layers 124, depositing polysilicon on the split gate dielectric layers 124 as split gate electrodes 122;

step 5: depositing the protective layer on the surface of the silicon wafer, photoetching a window to etch part of the polysilicon and the split gate dielectric layers, and then forming a gate trench on the top layer of the N-drift region 4, wherein the depth of the lower surface of the gate trench is greater than the junction depth of the lower surface of the P-type buried layer 5;

step 6: forming a gate dielectric layer 123 and a polysilicon isolation dielectric layer 125 in the gate trench, and then depositing polysilicon in the gate trench as a gate electrode 121, wherein the gate electrode 121 and the split gate electrode 122 are independent of each other and isolated by the polysilicon isolation dielectric layer 125; one side of the N-drift region 4, the P-type buried layer 5, the N-type carrier stored layer 6 and the P-type base region 7 are connected to the gate dielectric layer 123, and the other side of the N-drift region 4, the P-type buried layer 5, the N-type carrier stored layer 6 and the P-type base region 7 are connected to the split gate dielectric layer 124;

step 7: respectively implanting N-type impurities and P-type impurities on the top of the P-type base region 7 by masking, photoetching and ion implantation process to obtain an N+ emitter region 10 and a P+ emitter region 8 arranged side by side in contact with each other, wherein the N+ emitter region 10 is connected with the gate dielectric layer 123, and the P+ emitter region 8 is connected with the split gate dielectric layer 124;

step 8: depositing a dielectric layer on the front surface of the silicon wafer, forming an insulating dielectric layer 11 on upper surfaces of the gate electrode 121, the gate dielectric layer 123 and the polysilicon isolation dielectric layer 125 by photoetching and etching processes, then depositing a metal on the front surface of the silicon wafer, and forming an emitter metal 9 on the upper surfaces of the N+ emitter region 10, the P+ emitter region 8, the insulating dielectric layer 11, the split gate electrode 122 and the split gate dielectric layer 124;

step 9: flipping the silicon wafer, reducing the thickness of the silicon wafer, implanting the N-type impurities on the back surface of the silicon wafer and performing annealing to form an N-type field stop layer 3 of the device; and implanting the P-type impurities on the back surface of the N-type field stop layer 3 and performing annealing to form a P-type collector region 2; then depositing a metal on the back surface of the silicon wafer to form a collector metal 1.

Further, the N-type lightly doped monocrystalline silicon wafer has a thickness of 300 to 600 μm and a doping concentration of $10^{13}$ to $10^{14}/cm^3$.

Further, the P-type buried layer 5 is fabricated with an ion implantation energy of 200 to 500 keV and an implantation dose of $10^{13}$ to $10^{14}/cm^2$, or the N-type carrier stored layer 6 is fabricated with an ion implantation energy of 150 to 400 keV and an implantation dose of $10^{13}$ to $10^{14}/cm^2$, or the P-type base region 7 is fabricated with an ion implantation energy of 100 to 400 keV and an implantation dose of $10^{13}$ to $10^{14}/cm^2$, or the N+ emitter region 10 is fabricated with an energy of implantation of the N-type impurity of 30 to 60 keV and an implantation dose of $10^{15}$ to $10^{16}/cm^2$, or the P+ emitter region 8 is fabricated with an energy of implantation of the P-type impurity of 60 to 80 keV and an implantation dose of $10^{15}$ to $10^{16}/cm^2$.

Further, the N-type field stop layer 3 is fabricated with an ion implantation energy of 1500 to 2000 keV and an implantation dose of $10^{13}$ to $10^{14}/cm^2$ at an annealing temperature of 1200 to 1250° C. for 300 to 600 minutes; or, the P-type collector region 2 is fabricated with an implantation energy of 40 to 60 keV and an implantation dose of $10^{12}$ to $10^{13}/cm^2$ at an annealing temperature of 400 to 450° C. for 20 to 30 minutes.

Further, the order of forming the split gate electrode and the gate electrode structure is interchangeable.

Further, the order of forming the trench structure and forming the P-type buried layer 5, the N-type carrier stored layer 6 and the P-type base region 7 is interchangeable.

Further, the semiconductor material used in the device is any one or more of Si, SiC, GaAs, GaN, $Ga_2O_3$, AlN and diamond, and each structure can be made of the same semiconductor material or a combination of different semiconductor materials.

Further, in order to simplify the description, the device structure and the fabrication method are illustrated by taking an N-channel IGBT device as an example, but the present invention is also applicable to the fabrication of a P-channel IGBT device.

The working principle of the present invention is as follows:

For CSTBT, the introduction of N-type carrier stored layer will degrade the breakdown characteristics of the device. Another disadvantage is that it has large gate capacitance and saturation current. By increasing the distance between trenches and reducing the channel density of NMOS, the saturation current can be reduced, but this will lead to uneven current distribution on the surface of the device, thereby reducing the reliability of the device in operation. Therefore, the present invention provides a split gate CSTBT with current clamping PMOS. Based on the conventional CSTBT structure, the present invention introduces a split gate electrode 122 with equal potential to the emitter, and a P-type buried layer below the N-type carrier stored layer 6. When the device works in the blocking state, the PN junction between the P-type buried layer 5 and the N-drift region 4 withstands reverse bias. Therefore, the P-type buried layer 5 can isolate the N-type carrier stored layer 6, and shield the influence of the N-type carrier stored layer 6 on the breakdown characteristics of the device. At the same time, the split gate electrode 122 and the emitter metal 9 are equipotential, thereby the split gate electrode 122 forms charge compensation for the N-type carrier stored layer and weaken the influence of the N-type carrier stored layer 6 on the breakdown characteristics of the device. So the breakdown voltage of the device is greatly improved. Therefore, compared with the traditional CSTBT, the present invention can improve the doping concentration of the N-type carrier stored layer 6 to improve the carrier distribution during the forward conduction of the device, thereby improving the conductance modulation capability of the drift region, reducing the forward on-state voltage drop of the device, and improving the trade-off relationship between the on-state voltage drop and the turn-off loss. In addition, the gate electrode 121 and the split gate electrode 122 are located in the same trench, in which the P-type buried layer 5, the N-type carrier stored layer 6, the P-type base region 7 and the split gate electrode 122 form a parasitic PMOS structure. When the device is turn on, potential of the P-type buried layer 5 and the N-type carrier stored layer 6 may increase with the increase of the collector voltage. But when the potential of P-type buried layer 5 increases to a certain value, PMOS will be turned on. On the one hand, when PMOS is turned on, the N-type carrier stored layer 6 and the P-type buried layer 5 are equivalent to being connected to the emitter. So that part of the gate-collector capacitance is converted into the gate-emitter capacitance, which can effectively reduce the gate-collector capacitance (Miller capacitance), improve the switching speed of device and reduce the switching loss. At the same time, during the turn-off process of the device, the turn-on of the parasitic PMOS structure can increase the carrier extraction speed, reduce the turn-off loss, and further improve the trade-off relationship between the forward on-stage voltage drop and the turn-off loss. On the other hand, when the PMOS is turned on, the potential of N-type carrier stored layer 6 and P-type buried layer 5 can be clamped, which makes the NMOS channel of IGBT saturated in advance, thereby reducing the saturation current of IGBT and improving the short-circuit safe operating area (SCSOA) of the device. In addition, the split gate electrode and the gate electrode in the same trench can save the chip area and improve the chip integration. This also shortens the distance between PMOS and NMOS channels, which is beneficial to enhance the clamping effect of PMOS and improve the current uniformity in the chip during the turn-off process, avoid current concentration, and improve the reliability and reverse bias safe operating area (RBSOA) of the device.

The present invention has the advantages that:

On the basis of the traditional CSTBT, the influence of the N-type carrier stored layer 6 on the breakdown characteristics of the device is effectively eliminated by introducing the P-type buried layer and the split gate electrode with equal potential to the emitter metal. So that the doping concentration of the N-type carrier stored layer 6 can be increased to improve the carrier distribution during the forward conduction of the device. Thus the conductance modulation ability of the drift region is improved and the forward on-state voltage drop of the device is reduced. Moreover, the introduction of parasitic PMOS structure accelerates the carrier extraction speed during the turn-off process, improves the switching speed of the device, reduces the switching loss of the device, and further improves the trade-off relationship between the on-state voltage drop and the turn-off loss. The present invention clamps the electric potential of the N-type carrier stored layer and the P-type buried layer by turning on the PMOS structure. This can reduce the saturation current density of the device and improve the short-circuit safe operating area (SCSOA) of the device. This can also effectively reduce Miller capacitance and switching loss of the device. In addition, the split gate electrode and the gate electrode in the same trench can not only improve the integration level of the chip, but also shorten the distance between PMOS and NMOS channels, which can improve the clamping effect of PMOS. Therefore, the current uniformity inside the chip can be improved. And the reverse bias safe operating area (RBSOA) of the device can be improved.

In the drawings, the parts represented by reference signs are listed as follows:

1 is collector metal, 2 is P-type collector, 3 is N-type field stop layer, 4 is N-drift region, 5 is P-type buried layer, 6 is N-type carrier stored layer, 7 is P-type base region, 8 is P+ emitter region, 9 is emitter metal, 10 is N+ emitter region, 11 is insulating dielectric layer, 121 is gate electrode, 122 is split gate electrode, 123 is gate dielectric layer, 124 is split gate dielectric layer, 125 is polysilicon isolation dielectric layer, 13 is Schottky contact metal, 14 is super junction P-pillar, 15 is super junction N-pillar.

DETAILED DESCRIPTION OF THE EMBODIMENTS

The principles and features of the present invention are described below in conjunction with the accompanying drawings, and specific embodiments of the present invention are illustrated with an IGBT of 1200 V as an example, and the examples given are only for explanation of the present invention and are not intended to limit the scope of the present invention.

Figure 2:
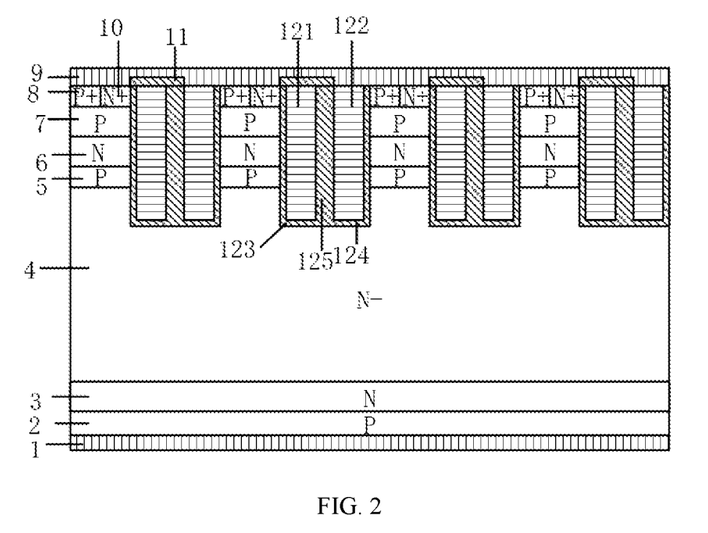
FIG. 2 is a structural schematic diagram of a split gate CSTBT with current clamping PMOS provided in embodiment 1 of the present invention, where four cells are connected in parallel.

As shown in FIG. 2, embodiment 1 of the present invention provides a split gate CSTBT with current clamping PMOS. Wherein the cell structure of the split gate CSTBT comprises a back collector metal 1, a P-type collector region 2, an N-type field stop layer 3 and an N-drift region 4 which are stacked in sequence from bottom to top. The upper layer of the N-drift region 4 has a P-type buried layer 5 and a trench structure which are alternately arranged, and the depth of the lower surface of the trench structure is greater than the junction depth of the lower surface of the P-type buried layer 5;

The upper surface of the P-type buried layer 5 is provided with an N-type carrier stored layer 6. The upper surface of the N-type carrier stored layer 6 is provided with a P-type base region 7. And the upper surface of the P-type base region 7 is provided with an N+ emitter region 10 and a P+ emitter region 8 in side contact with each other;

The trench structure includes a gate electrode 121, a split gate electrode 122, a gate dielectric layer 123, a split gate dielectric layer 124, and a polysilicon isolation dielectric layer 125. Wherein the gate electrode 121 and the split gate electrode 122 are isolated by the polysilicon isolation dielectric layer 125. The depth of the lower surface of the gate electrode 121 is greater than the junction depth of the lower surface of the P-type buried layer 5. And the gate electrode 121 is connected to one side of the N-drift region 4, the P-type buried layer 5, the N-type carrier stored layer 6, the P-type base region 7 and the N+ emitter region 10 through the gate dielectric layer 123. The depth of the lower surface of the split gate electrode 122 is greater than the depth of the lower surface of the P-type buried layer 5. And the split gate electrode 122 is connected to the other side of the N-drift region 4, the P-type buried layer 5, the N-type carrier stored layer 6, the P-type base region 7 and the P+ emitter region 8 through the split gate dielectric layer 124;

The upper surfaces of the gate electrode 121, the gate dielectric layer 123, and the polysilicon isolation dielectric layer 125 are covered with an insulating dielectric layer 11. And the upper surfaces of the split gate electrode 122, the split gate dielectric layer 124, the insulating dielectric layer 11, the N+ emitter region 10, and the P+ emitter region 8 are covered with an emitter metal 9. The split gate electrode 122 and the emitter metal 9 have equal potentials.

Figure 3:
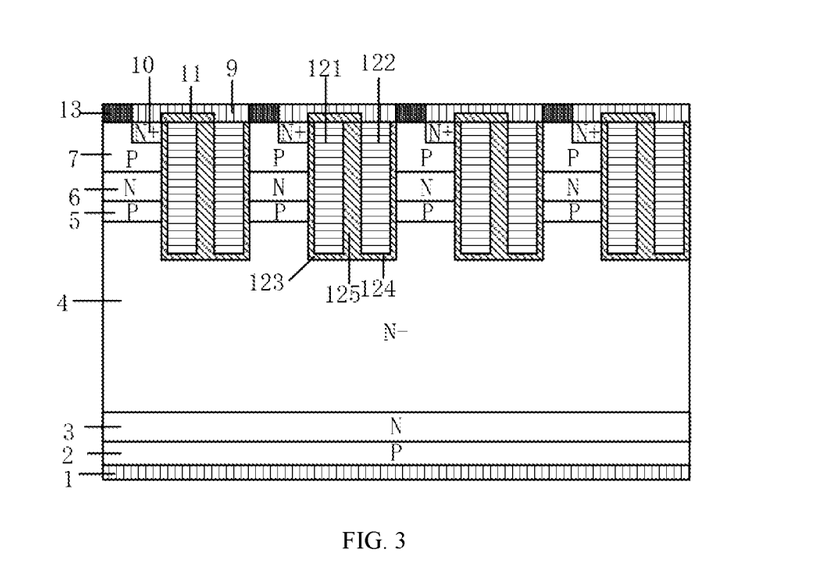
FIG. 3 is a structural schematic diagram of a split gate CSTBT with current clamping PMOS provided in embodiment 2 of the present invention, where four cells are connected in parallel.

As shown in FIG. 3, embodiment 2 of the present invention provides a split gate CSTBT with current clamping PMOS. wherein the cell structure of the split gate CSTBT comprises a back collector metal 1, a P-type collector region 2, an N-type field stop layer 3 and an N-drift region 4 which are stacked in sequence from bottom to top. The upper layer of the N-drift region 4 has a P-type buried layer 5 and a trench structure which are alternately arranged. And the depth of the lower surface of the trench structure is greater than the junction depth of the lower surface of the P-type buried layer 5;

The upper surface of the P-type buried layer 5 is provided with an N-type carrier stored layer 6. The upper surface of the N-type carrier stored layer 6 is provided with a P-type base region 7. And the upper layer of P-type base region 7 has an N+ emitter region 10 on the side near the gate electrode;

The trench structure includes a gate electrode 121, a split gate electrode 122, a gate dielectric layer 123, a split gate dielectric layer 124, and a polysilicon isolation dielectric layer 125. Wherein the gate electrode 121 and the split gate electrode 122 are isolated by a polysilicon isolation dielectric layer 125. The depth of the lower surface of the gate electrode 121 is greater than the junction depth of the lower surface of the P-type buried layer 5. And the gate electrode 121 is connected to one side of the N-drift region 4, the P-type buried layer 5, the N-type carrier stored layer 6, the P-type base region 7 and the N+ emitter region 10 through the gate dielectric layer 123. The depth of the lower surface of the split gate electrode 122 is greater than the depth of the lower surface of the P-type buried layer 5. And the split gate electrode 122 is connected to the other side of the N-drift region 4, the P-type buried layer 5, the N-type carrier stored layer 6 and the P-type base region 7 through the split gate dielectric layer 124.

The upper surface of the P-type base region 7 is covered with a Schottky contact metal 13. The upper surfaces of the gate electrode 121, the gate dielectric layer 123, and the polysilicon isolation dielectric layer 125 are covered with an insulating dielectric layer 11. The upper surfaces of the split gate electrode 122, the split gate dielectric layer 124, the insulating dielectric layer 11 and the N+ emitter region 10 are covered with an emitter metal 9. And the split gate electrode 122 and the Schottky contact metal 13 have equal potential with the emitter metal 9.

By introducing the Schottky contact metal 13 with the equal potential to the emitter metal 1, the above embodiment reduces the on-state voltage drop of the PMOS, so that the PMOS can be turned on faster. This can have a better clamping effect during on-state, so it can better improve the short-circuit safe operating area of the device and reduce the Miller capacitance. In addition, when the device is turned off, the hole extraction speed can be further improved, and the trade-off relationship between the on-state voltage drop and the turn-off loss can be further improved.

Figure 4:
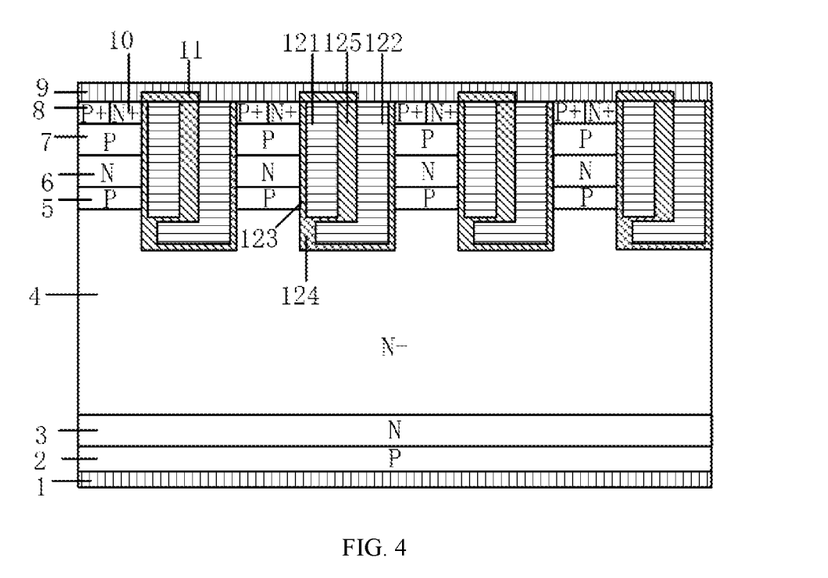
FIG. 4 is a structural schematic diagram of a split gate CSTBT with current clamping PMOS provided in embodiment 3 of the present invention, where four cells are connected in parallel.

As shown in FIG. 4, based on embodiment 1 or embodiment 2, embodiment 3 of the present invention provides a split gate CSTBT with current clamping PMOS, where a split gate electrode 122 is L-shaped and half encloses the gate electrode 121. And the lower surface and side surface of the gate electrode 121 are isolated from the split gate electrode 122 by the polysilicon isolation dielectric layer 125.

In the above embodiment, the depth of etching the polysilicon and the split gate dielectric layer is controlled by adjusting the process, so as to change the shape of the split gate electrode 122. By reducing the coupling area between the gate electrode and the N-drift region, the L-shaped split gate can reduce the Miller capacitance, improve the switching speed and reduce the switching loss of the device. In addition, by increasing the thickness of the split gate dielectric layer 124, this example can effectively improve the phenomenon of electric field concentration at the bottom of the trench in the blocking state, and improve the voltage withstanding capability of the device.

Figure 5:
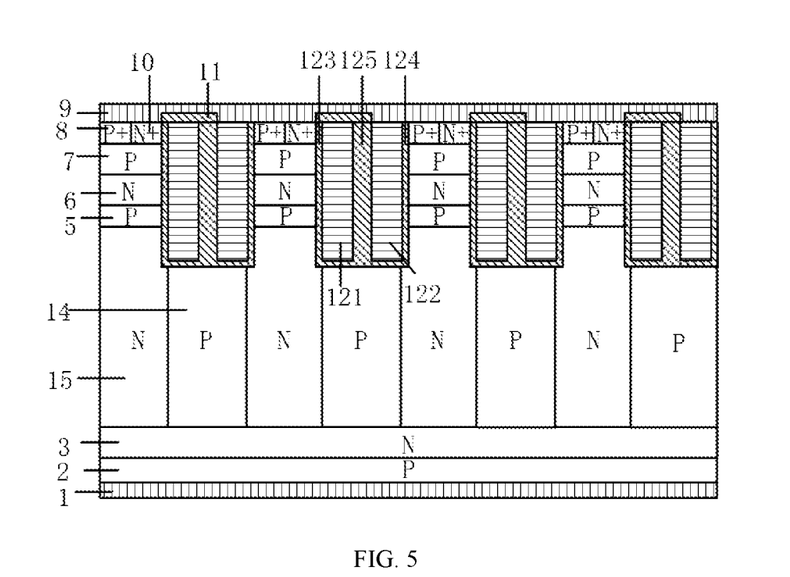
FIG. 5 is a structural schematic diagram of a split gate CSTBT with current clamping PMOS provided in embodiment 4 of the present invention, where four cells are connected in parallel.

As shown in FIG. 5, based on embodiment 1, embodiment 4 of the present invention provides a split gate CSTBT with current clamping PMOS, where N-drift region 4 has a super junction P-pillar 14 and a super junction N-pillar 15 in side contact with each other. The super junction N-pillar 15 is located below the P-type buried layer 5, and the super junction P-pillar 14 is located below the trench structure. And the super junction P-pillar 14 and the super junction N-pillar 15 meet charge balance requirements.

In the above-mentioned embodiment, the one-dimensional withstand voltage in the drift region is changed into the two-dimensional withstand voltage by introducing the super junction P-pillar 14 and the super junction N-pillar 15 in the drift region 4, thereby improving the trade-off relationship between the on-state voltage drop and the breakdown voltage and improving the device performance.

Optionally, the super junction N-pillar 15 has a doping concentration greater than or equal to the N-drift region 4.

Optionally, the split gate dielectric layer 124 has a thickness greater than or equal to the gate dielectric layer 123.

The above embodiment can improve the reliability of the dielectric layer in the blocking state.

Optionally, the semiconductor material used by the device is any one or more of Si, SiC, GaAs, GaN, $Ga_2O_3$, AlN and diamond.

Optionally, the device structure is not only suitable for IGBT devices, but also suitable for MOSFET devices by replacing the P-type collector region 2 on the back surface of the device with an N-type doping.

Embodiment 5 of the present invention is an illustration of the split gate CSTBT with current clamping PMOS at a voltage level of 1200V. And devices with different performance parameters can be fabricated as needed according to the common knowledge in the art.

Figure 6:
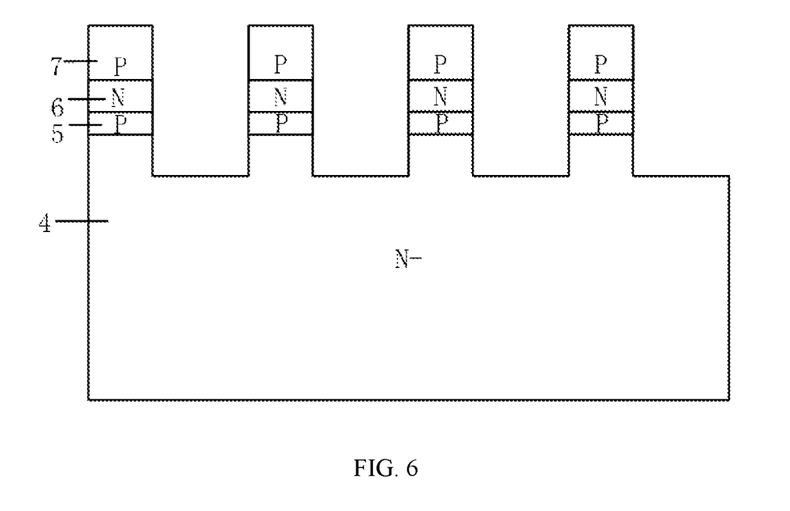
FIG. 6 is a structural schematic diagram of a split gate CSTBT with current clamping PMOS provided in embodiment 5 of the present invention, where four cells are connected in parallel after forming a P-type buried layer 5, an N-type carrier stored layer 6 and a P-type base region 7 and performing trench etching.
Figure 7:
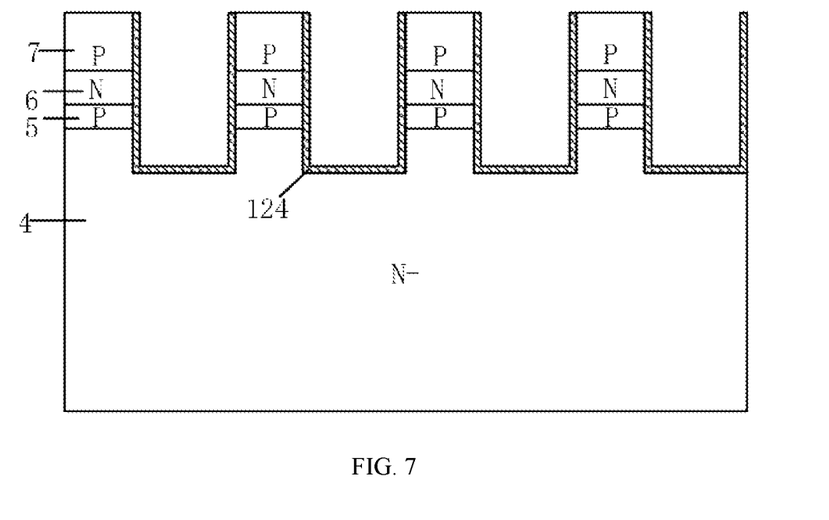
FIG. 7 is a structural schematic diagram of a split gate CSTBT with current clamping PMOS provided in embodiment 5 of the present invention, where four cells are connected in parallel after split gate dielectric layers 124 are formed at bottom and side walls of the trench.
Figure 8:
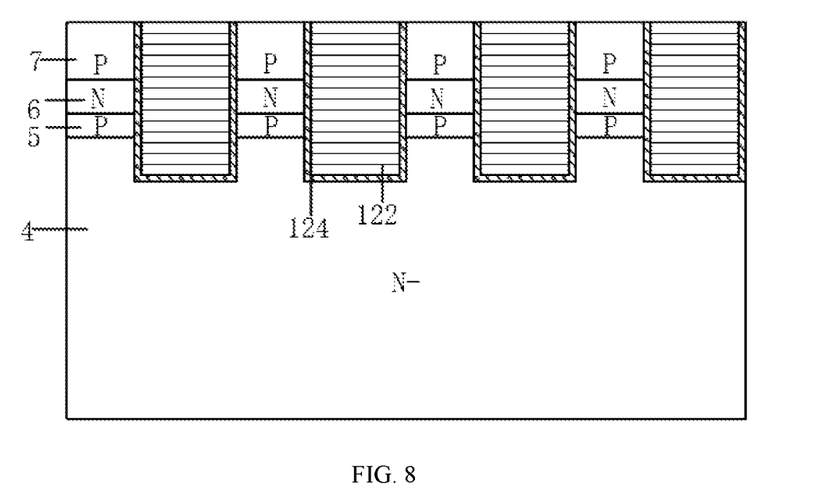
FIG. 8 is a structural schematic diagram of a split gate CSTBT with current clamping PMOS provided in embodiment 5 of the present invention, where four cells are connected in parallel after a split gate electrode 122 is formed by filling polysilicon in the trench.
Figure 9:
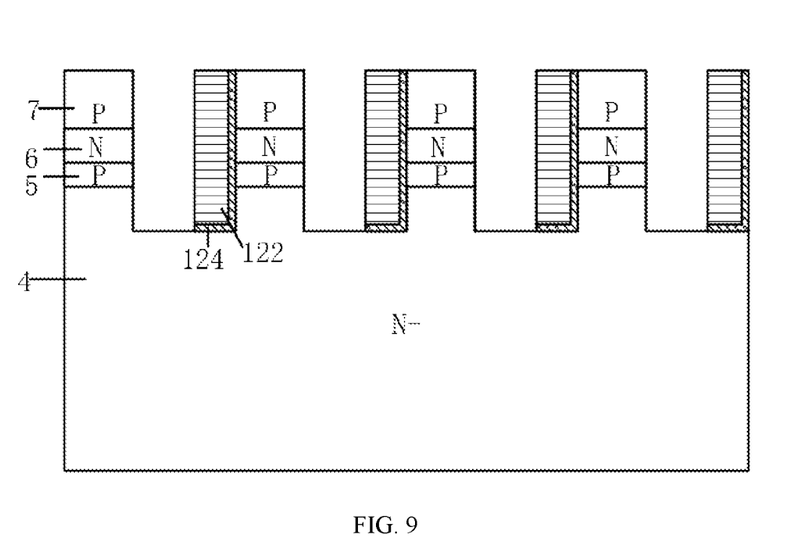
FIG. 9 is a structural schematic diagram of a split gate CSTBT with current clamping PMOS provided in embodiment 5 of the present invention, where four cells are connected in parallel after a gate trench is formed by etching partial polysilicon and oxide layer in the split gate trench.
Figure 10:
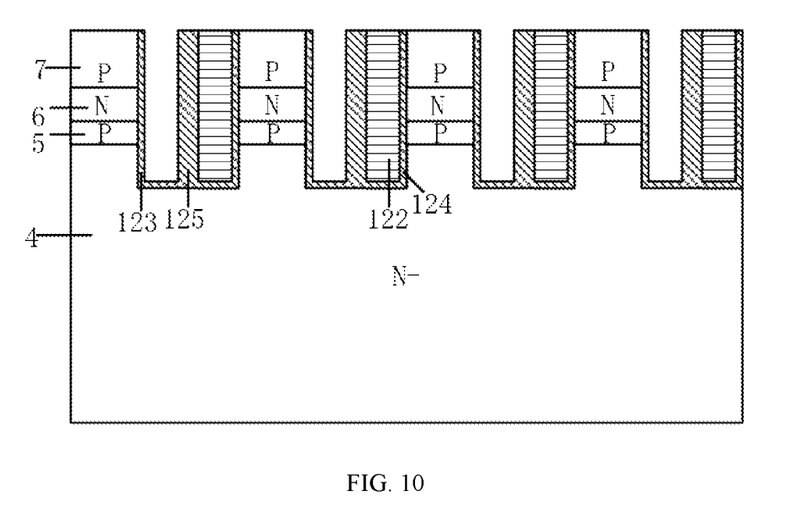
FIG. 10 is a schematic structure diagram of a split gate CSTBT with current clamping PMOS provided in embodiment 5 of the present invention, where four cells are connected in parallel after a gate dielectric layer 123 and a polysilicon isolation dielectric layer 125 are formed in the gate trench.
Figure 11:
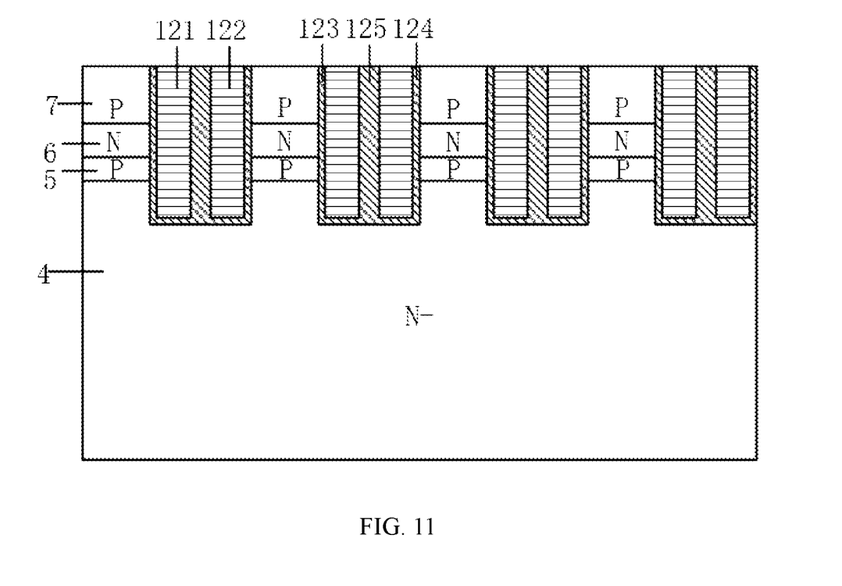
FIG. 11 is a schematic structure diagram of a split gate CSTBT with current clamping PMOS provided in embodiment 5 of the present invention, where four cells are connected in parallel after a gate electrode 121 is formed by depositing polysilicon in the gate trench.
Figure 12:
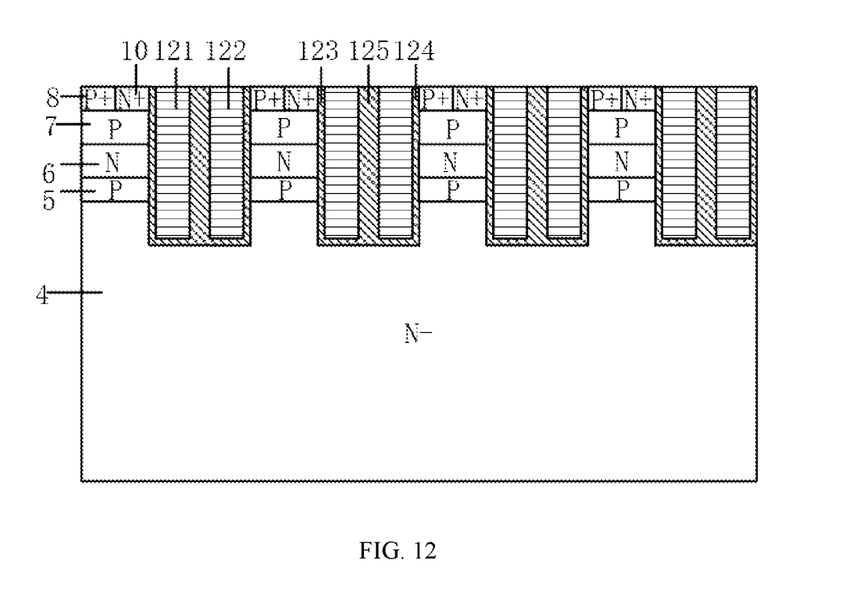
FIG. 12 is a schematic structure diagram of a split gate CSTBT with current clamping PMOS provided in embodiment 5 of the present invention, where four cells are connected in parallel after an N+ emitter region 10 and a P+ emitter region 8 are formed by ion implantation.
Figure 13:
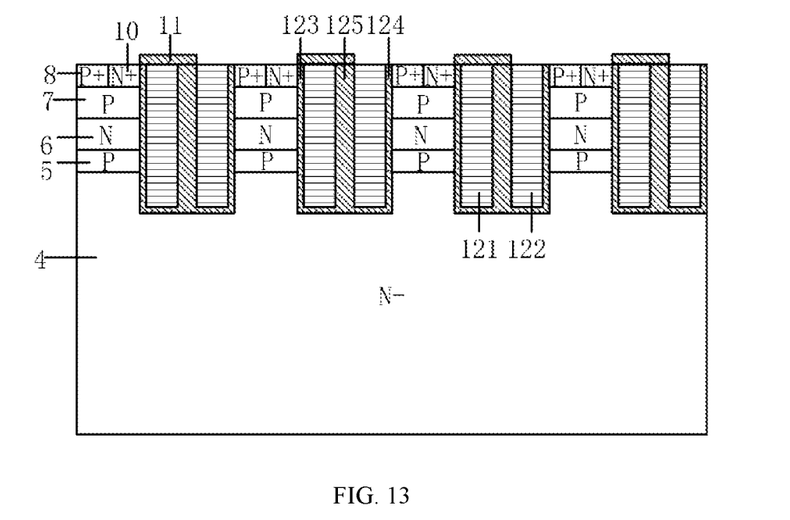
FIG. 13 is a schematic structure diagram of a split gate CSTBT with current clamping PMOS provided in embodiment 5 of the present invention, where four cells are connected in parallel after insulating dielectric layers 11 is formed on upper surfaces of the gate electrode 121, the gate dielectric layer 123 and the polysilicon insulating dielectric layer 125.
Figure 14:
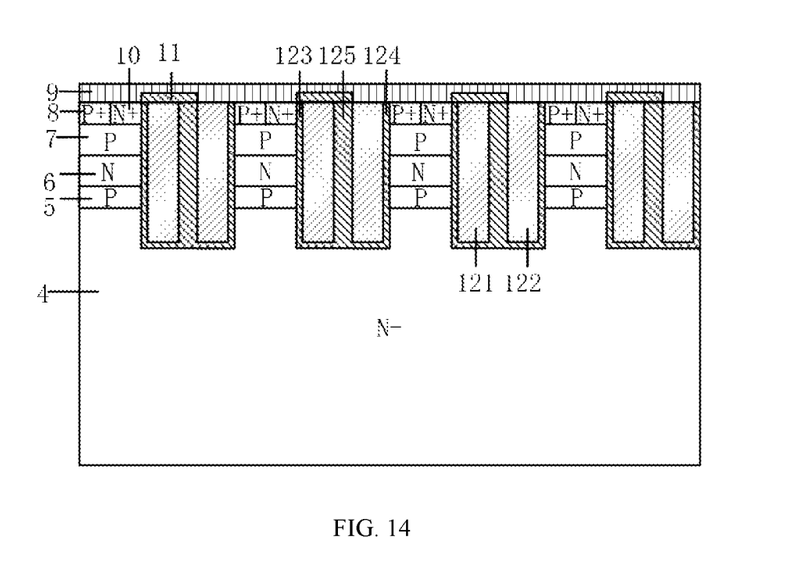
FIG. 14 is a schematic structure diagram of a split gate CSTBT with current clamping PMOS provided in embodiment 5 of the present invention, where four cells are connected in parallel after an emitter metal is formed by metal deposition on the front surface.
Figure 15:
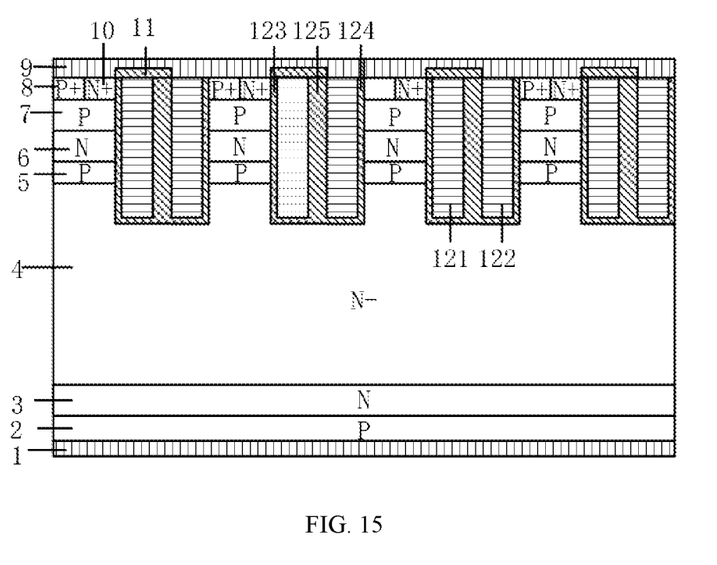
FIG. 15 is a schematic structure diagram of a split gate CSTBT with current clamping PMOS provided in embodiment 5 of the present invention, where four cells are connected in parallel after an N-type field stop layer, a P+ collector region and a collector metal are formed on the back surface.

As shown in FIGS. 6-15, a manufacturing method of the split gate CSTBT with current clamping PMOS provided in embodiment 5 of the present invention includes the following steps:

step 1: adopting an N-type lightly doped monocrystalline silicon wafer has a thickness of 300 to 600 μm and a doping concentration of $10^{13}$ to $10^{14}$/cm$^3$ as an N-drift region 4 of the new CSTBT device;

step 2: growing a layer of field oxide layer on a surface of the silicon wafer, resulting in an active region by photoetching, then growing a layer of pre-oxide layer, making a P-type buried layer 5 by ion implantation of P-type impurities above the N-drift region 4 with an ion implantation energy of 200 to 500 keV and an implantation dose of $10^{13}$ to $10^{14}$/cm$^2$, making an N-type carrier stored layer 6 by ion implantation of N-type impurities on the upper surface of the P-type buried layer 5 with an ion implantation energy of 150 to 400 keV and an implantation dose of $10^{13}$ to $10^{14}$/cm$^2$, and making a P-type base region 7 by ion implantation of the P-type impurities on the upper surface of the N-type carrier stored layer 6 with an ion implantation energy of 100 to 400 keV and an implantation dose of $10^{13}$ to $10^{14}/cm^2$;

step 3: depositing a protective layer on the surface of the silicon wafer, photoetching a window to perform trench silicon etching, thereby etching and forming a plurality of split gate trenches on the top layer of the N-drift region 4, wherein the N-drift region 4, the P-type buried layer 5, the N-type carrier stored layer 6 and the P-type base region 7 are arranged between each split gate trench, and the depth of the lower surface of each split gate trench is greater than the junction depth of the lower surface of the P-type buried layer 5, as shown in FIG. 6;

step 4: forming dielectric layers on the bottom and side walls of the split gate trench as split gate dielectric layers 124 in an $O_2$ atmosphere at a temperature of 1050° C. to 1150° C., as shown in FIG. 7, and then depositing polysilicon on the split gate dielectric layers 124 at a temperature of 750° C. to 950° C., then reverse etching off excess polysilicon on the surface to obtain split gate electrodes 122, as shown in FIG. 8.

step 5: depositing the protective layer on the surface of the silicon wafer, photoetching a window to etch part of the polysilicon and the dielectric layers, and then forming a gate trench on the top layer of the N-drift region 4, as shown in FIG. 9, wherein the depth of the lower surface of the gate trench is greater than the junction depth of the lower surface of the P-type buried layer 5;

step 6: forming a gate dielectric layer 123 and a polysilicon isolation dielectric layer 125 in the gate trench in an $O_2$ atmosphere at a temperature of 1050° C. to 1150° C., as shown in FIG. 10, and then depositing polysilicon in the gate trench and reversely etching the polysilicon on the surface to obtain a gate electrode 121, as shown in FIG. 11, wherein the gate electrode 121 and the split gate electrode 122 are independent of each other and isolated by the polysilicon isolation dielectric layer 125; one side of the N-drift region 4, the P-type buried layer 5, the N-type carrier stored layer 6 and the P-type base region 7 are connected to the gate dielectric layer 123, and the other side of the N-drift region 4, the P-type buried layer 5, the N-type carrier stored layer 6 and the P-type base region 7 are connected to the split gate dielectric layer 124;

step 7: respectively implanting N-type impurities and P-type impurities on the top of the P-type base region 7 by masking, photoetching and ion implantation process with an energy of implantation of the N-type impurity of 30 to 60 keV and an implantation dose of $10^{15}$ to $10^{16}/cm^2$, and an energy of implantation of the P-type impurity of 60 to 80 keV and an implantation dose of $10^{15}$ to $10^{16}/cm^2$ at an annealing temperature of 900° C. for 20 to 30 minutes, to obtain an N+ emitter region 10 and a P+ emitter region 8 arranged side by side in contact with each other, as shown in FIG. 12, wherein the N+ emitter region 10 is connected with the gate dielectric layer 123, and the P+ emitter region 8 is connected with the split gate dielectric layer 124;

step 8: depositing a dielectric layer on the front surface of the silicon wafer, forming an insulating dielectric layer 11 on upper surfaces of the gate electrode 121, the gate dielectric layer 123 and the polysilicon isolation dielectric layer 125 by photoetching and etching processes, as shown in FIG. 13, then depositing a metal on the front surface of the silicon wafer, and forming an emitter metal 9 on upper surfaces of the N+ emitter region 10, the P+ emitter region 8, the insulating dielectric layer 11, the split gate electrode 122 and the split gate dielectric layer 124, as shown in FIG. 14; and step 9: flipping the silicon wafer, reducing the thickness of the silicon wafer, implanting the N-type impurities on the back surface of the silicon wafer and annealing to form an N-type field stop layer 3 of the CSTBT device, wherein the N-type field stop layer 3 has a thickness of 15 to 30 μm, an ion implantation energy of 1500 to 2000 keV and an implantation dose of $10^{13}$ to $10^{14}/cm^2$, and is annealed at a temperature of 1200 to 1250° C. for 300 to 600 minutes; and implanting the P-type impurities on the back surface of the N-type field stop layer 3 to form a P-type collector region 2 with an implantation energy of 40 to 60 keV and an implantation dose of $10^{12}$ to $10^{13}/cm^2$ and performing annealing on the back surface in an atmosphere of $H_2$ mixed with $N_2$ at a temperature of 400 to 450° C. for 20 to 30 minutes; then depositing a metal on the back surface of the silicon wafer to form a collector metal 1, as shown in FIG. 15, thereby completing the fabrication of the split gate CSTBT with current clamping PMOS.

Optionally, the order of forming the split gate electrode and the gate electrode structure is interchangeable.

Optionally, the order of forming the trench structure and forming the P-type buried layer 5, the N-type carrier stored layer 6 and the P-type base region 7 is interchangeable.

Optionally, the fabrication of the N-type field stop layer 3 may be made prior to the fabrication of the device front surface structure; or a double-layer epitaxial material with the N-type field stop layer 3 and the N-drift region 4 is directly selected as the silicon wafer material for the process initiation.

Optionally, materials of the insulating dielectric layer 11, the gate dielectric layer 123, the split gate dielectric layer 124 and the polysilicon isolation dielectric layer 125 in the present invention may be the same material or a combination of different materials.

Optionally, the semiconductor material used in the device is any one or more of Si, SiC, GaAs, GaN, $Ga_2O_3$, AlN and diamond, and each structure can be made of the same semiconductor material or a combination of different semiconductor materials.

Optionally, in order to simplify the description, the device structure and the fabrication method are illustrated by taking an N-channel IGBT device as an example, but the present invention is also applicable to the fabrication of a P-channel IGBT device.

On the basis of the traditional CSTBT structure, the present invention introduces a P-type buried layer under an N-type carrier stored layer, and a split gate electrode with equal potential to the emitter on the sides of the N-type carrier stored layer, P-type base region and the P+ emitter region. Therefore, the present invention integrates a PMOS structure with the P-type buried layer as a source electrode, the N-type carrier stored layer as a base region, the P-type base region and P+ emitter region as a drain electrode and the split gate as a gate electrode. The P-type buried layer and the split gate electrode play an effective role in charge compensation for the N-type carrier stored layer, which avoids the adverse influence of the doping concentration and thickness of the N-type carrier stored layer on the breakdown voltage of the device. So the concentration of the N-type carrier stored layer can be further increased, and the carrier distribution during forward conduction of the device can be improved, thereby the forward on-state voltage drop and the on-state loss of the device can be reduced. In addition, during the turn-off of the device, the excess holes in the drift region can be quickly pumped out through the PMOS structure, thereby increasing the switching speed of the device, reducing the switching loss of the device, and further improving the trade-off relationship between the forward on-state voltage drop and the turn-off loss. Moreover, potential of the N-type carrier stored layer and the P-type buried layer will increase with the increase of collector forward bias voltage during forward conduction. When potential of the P-type buried layer increases to a certain value, the PMOS will be turned on. On the one hand, when the PMOS is turned on, the P-type buried layer and N-type carrier stored layer are equivalent to being connected to the emitter. So that part of gate-collector capacitance will be converted into gate-emitter capacitance, which will effectively reduce the gate-collector capacitance (Miller capacitance), improve the switching speed and reduce the switching loss of the device. On the other hand, when PMOS is turned on, the potentials of the N-type carrier stored layer and the P-type buried layer can be clamped. When the collector bias voltage of the device increases further, the NMOS channel potential will not increase further, so that the saturation current of the device will be greatly reduced and the short-circuit safe operating area (SCSOA) of the device will be greatly improved. In addition, the split gate electrode and the gate electrode in the same trench can save the chip area and improve the chip integration. This also shortens the distance between PMOS and NMOS channels, which is beneficial to enhance the clamping effect of PMOS, and improve the current uniformity in the chip during the turn-off process, and avoid current concentration, and improve the reliability and reverse bias safe operating area (RBSOA) of the device.

In the description of the present invention, it should be understood that orientation or positional relationships indicated by terms such as "center", "longitudinal", "transverse", "length", "width", "thickness", "up", "down", "front", "back", "left", "right", "vertical", "horizontal", "top", "bottom", "inner", "outer", "clockwise", "counter-clockwise", "axial", "radial", "circumferential", etc. are based on the orientation or positional relationships shown in the drawings, for ease of description of the present invention and simplification of the description only, these terms do not indicate or imply that the apparatus or element referred to must have a specific orientation or be constructed and operated in a specific orientation, and therefore cannot be construed as limitations to the present invention.

In the present invention, the terms "install", "connect", "couple", "fix" and the like are to be understood in a broad sense, unless otherwise expressly specified and limited, for example, it can be a fixed connection, may also be a detachable connection, or be integral; it can be a mechanical connection, can also be an electrical connection; it can be directly connected, or indirectly connected through an intermediate medium, or it can be an internal connection of two elements or an interactive relationship of two elements, unless otherwise clearly defined. For those ordinarily skilled in the art, the specific meanings of the above terms in the present invention will be understood according to the specific circumstances.

In the present invention, the first feature "above" or "below" the second feature may be a direct contact between the first and second features, or an indirect contact between the first and second features via an intermediate medium, unless otherwise expressly specified and defined. Moreover, the first feature is "over", "above" and "on" the second feature may indicate that the first feature directly above or obliquely above the second feature, or simply indicates that a horizontal height of the first feature is higher than that of the second feature. The first feature is "under", "underneath" and "below" the second feature may indicate that the first feature is directly below or obliquely below the second feature, or simply indicates that the horizontal height of the first feature is less than that of the second feature.

In the description of the description, illustrations of the reference terms "one embodiment," "some embodiments," "example," "specific example," or "some examples," etc. mean that specific features, structures, materials, or features described in connection with the embodiment or example are encompassed in at least one embodiment or example of the present invention. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may connect and combine different embodiments or examples described in this description and features of different embodiments or examples.

The above are merely the better embodiments of the present invention and are not intended to limit the present invention, any modification, equivalent replacement, improvement, etc. made within the spirit and principles of the present invention should be included in the scope of protection of the present invention.

The invention claimed is:

1. A split gate carrier stored trench bipolar transistor (CSTBT) with a current clamping Positive-channel Metal Oxide Semiconductor (PMOS), wherein a cell structure of the split gate CSTBT comprises a back collector metal, a P-type collector region, an N-type field stop layer and an N-drift region, wherein the back collector metal, the P-type collector region, the N-type field stop layer, and the N-drift region are stacked in sequence from bottom to top; a P-type buried layer and a trench structure are alternately arranged on an upper layer of the N-drift region, and a depth of a lower surface of the trench structure is greater than a junction depth of a lower surface of the P-type buried layer;

an upper surface of the P-type buried layer is provided with an N-type carrier stored layer, an upper surface of the N-type carrier stored layer is provided with a P-type base region, and an upper layer of the P-type base region comprises an N+ emitter region in on a side adjacent to a gate electrode;

the trench structure comprises the gate electrode, a split gate electrode, a gate dielectric layer, a split gate dielectric layer, and a polysilicon isolation dielectric layer; wherein the gate electrode and the split gate electrode are isolated by the polysilicon isolation dielectric layer; a depth of a lower surface of the gate electrode is greater than the junction depth of the lower surface of the P-type buried layer, and the gate electrode is connected to a first side of the N-drift region, a first side of the P-type buried layer, a first side of the N-type carrier stored layer, a first side of the P-type base region and a first side of the N+ emitter region through the gate dielectric layer; a depth of a lower surface of the split gate electrode is greater than a depth of the lower surface of the P-type buried layer, and the split gate electrode is connected to a second side of the N-drift region, a second side of the P-type buried layer, a second side of the N-type carrier stored layer and a second side of the P-type base region through the split gate dielectric layer;

an upper surface of the P-type base region is covered with a Schottky contact metal; an upper surface of the gate electrode, an upper surface of the gate dielectric layer, and an upper surface of the polysilicon isolation dielectric layer are covered with an insulating dielectric layer; an upper surface of the split gate electrode, an upper surface of the split gate dielectric layer, an upper surface of the insulating dielectric layer and an upper surface of the N+ emitter region are covered with an emitter metal, and potentials of the split gate electrode and the Schottky contact metal are equal to a potential of the emitter metal.

2. The split gate CSTBT with the current clamping PMOS according to claim 1, wherein the split gate electrode is L-shaped and half encloses the gate electrode, and the lower surface of the gate electrode and a side surface of the gate electrode are isolated from the split gate electrode by the polysilicon isolation dielectric layer.

3. The split gate CSTBT with the current clamping PMOS according to claim 1, wherein the N-drift region comprises a super junction P-pillar and a super junction N-pillar in side contact with each other; the super junction N-pillar is located below the P-type buried layer, and the super junction P-pillar is located below the trench structure; and the super junction P-pillar and the super junction N-pillar meet charge balance requirements.

4. The split gate CSTBT with the current clamping PMOS according to claim 1, wherein a thickness of the split gate dielectric layer is greater than a thickness of the gate dielectric layer.

5. The split gate CSTBT with the current clamping PMOS according to claim 1, wherein a semiconductor material used by the split gate CSTBT is at least one of Si, SiC, GaAs, GaN, $Ga_2O_3$, AlN and diamond.

* * * * *